United States Patent [19]
Shirai

[11] Patent Number: 5,422,505
[45] Date of Patent: Jun. 6, 1995

[54] FET HAVING GATE INSULATING FILMS WHOSE THICKNESS IS DIFFERENT DEPENDING ON PORTIONS

[75] Inventor: Koji Shirai, Kawasaki, Japan

[73] Assignee: Kabushiki Kaisha Toshiba, Kawasaki, Japan

[21] Appl. No.: 155,911

[22] Filed: Nov. 23, 1993

Related U.S. Application Data

[63] Continuation of Ser. No. 777,597, Oct. 16, 1991, abandoned.

[30] Foreign Application Priority Data

Oct. 17, 1990 [JP] Japan .................................. 2-280201

[51] Int. Cl.⁶ ........................................... H01L 29/78
[52] U.S. Cl. ..................... 257/327; 257/345; 257/401; 257/411
[58] Field of Search ................ 357/23.3, 23.8, 23.12, 357/23.14; 257/327, 335, 345, 401, 411, 655

[56] References Cited

U.S. PATENT DOCUMENTS 4,990,983  2/1991  Custode et al. .................... 357/23.8

FOREIGN PATENT DOCUMENTS 61-51875  3/1986  Japan .
8001122  5/1980  WIPO ................................ 257/345

Primary Examiner—Mark V. Prenty
Attorney, Agent, or Firm—Finnegan, Henderson, Farabow, Garrett & Dunner

[57] ABSTRACT

A field effect transistor comprises a first conductive type semiconductor substrate, a second conductive type source region formed on the semiconductor substrate, a second conductive type drain region formed on the semiconductor substrate and non-contacting the source region, and a gate electrode formed on a channel region between the source region and the drain region through a gate insulating film, wherein the thickness of the gate insulating film is thickened at least in a two-step manner in a direction from the source region to the drain region, impurity concentration of the respective channel regions under the gate insulating film having a different film thickness is different, and impurity concentration of the channel region under the thick film portion of the gate insulating film is lower than that of the channel region under the thin film portion of the gate insulating film.

3 Claims, 4 Drawing Sheets

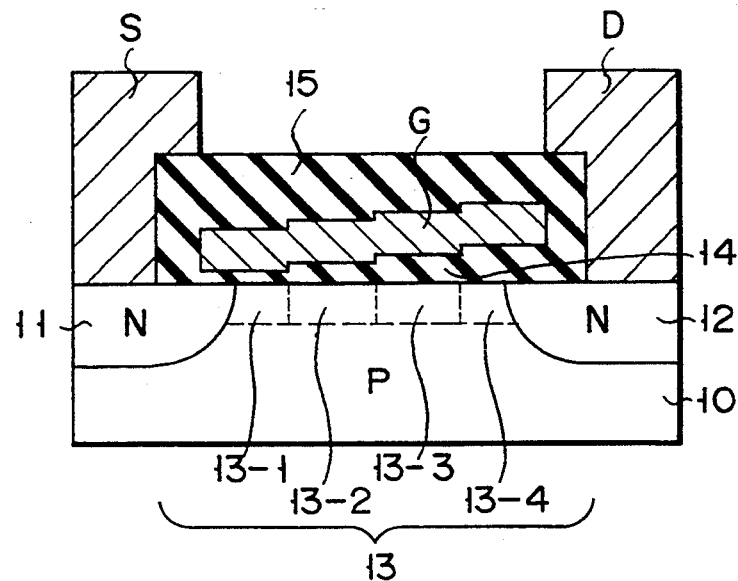
F I G. 1
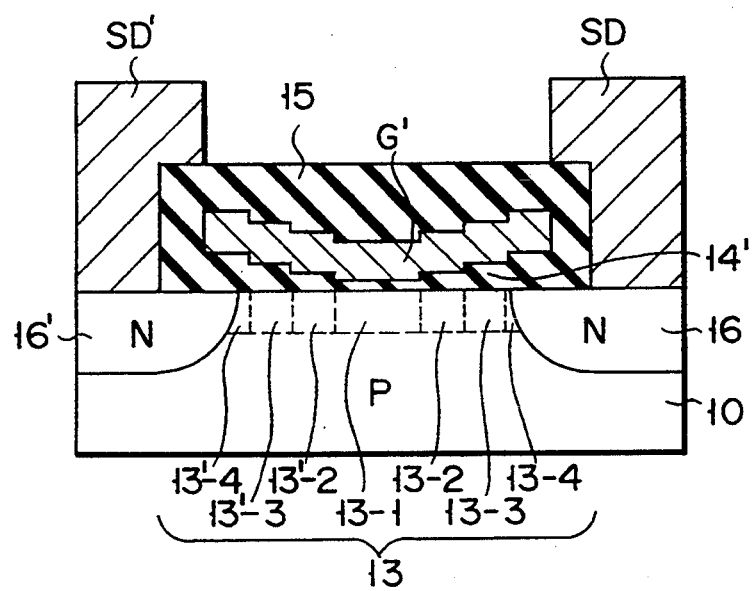
F I G. 3

FET HAVING GATE INSULATING FILMS WHOSE THICKNESS IS DIFFERENT DEPENDING ON PORTIONS

This application is a continuation, of application Ser. No. 07/777,597, filed Oct. 16, 1991, now abandoned.

Background of the Invention

1. Field of the Invention

The present invention relates to a semiconductor device such as an individual semiconductor element or a semiconductor integrated circuit, and more particularly to the structure of a MOSFET (insulating gate type field effect transistor) formed on a semiconductor substrate.

2. Description of the Related Art

In a conventional MOSFET, a source region, which is formed of an N type impurity diffusion layer, and a drain region are formed on a part of a surface of a P type semiconductor substrate. On a channel region between the source and drain, there is formed a gate electrode through a gate insulating film. The source region and drain region are in contact with each other to correspond to the source region and drain region. In this case, the thickness of the gate insulating film is uniform.

Due to this, in a case where the element is made fine or highly pressurized, the gate insulating film cannot largely thinned since the thickness of the gate insulating film is determined at the portion having the strongest electric filed (between the drain and gate electrode). Due to this, a switching speed (response speed) is limited. Moreover, since the gate insulating film cannot be largely thinned, impurity concentration of an inverting layer to be generated in the channel region becomes low. Due to this, it is difficult to reduce an on-resistance or improve a current driving ability.

SUMMARY OF THE INVENTION

An object of the present invention is to provide a semiconductor device showing a distribution of electric field in a suitable MOSFET in an operation mode, and its manufacturing method.

The present invention provides a field effect transistor, comprising a first conductive type semiconductor substrate, a second conductive type source region formed on the semiconductor substrate, a second conductive type drain region formed on the semiconductor substrate and non-contacting the source region, and a gate electrode formed on a channel region between the source region and the drain region through a gate insulating film, wherein the thickness of the gate insulating film is thickened at least in a two-step manner in a direction from the source region to the drain region, impurity concentration of the respective channel regions under the gate insulating film having a different film thickness is different, and impurity concentration of the channel region under the thick film portion of the gate insulating film is lower than that of the channel region under the thin film portion of the gate insulating film.

By use of the above-structured field effect transistor, the gate insulating film, which is in a portion (between the drain and gate electrode) having the strongest electric field can be made thickest, and impurity concentration of the channel region right under the gate insulating film is lowered. Due to this, an uniform distribution of electric filed in MOSFET can be realized, and reliability of the gate insulating film on the drain side can be ensured. Moreover, a threshold voltage is reduced, thereby making possible to improve electrical pressure.

In other words, by suitably arranging the distribution of the film thickness of the gate insulating film and that of impurity concentration of the channel region, a punch-through of a depletion dropping from the drain to the source can be prevented, thereby making it possible to shorten the distance between the source and drain, and make the element fine. Moreover, by reducing the whole thickness of the gate insulating film, the switch speed of FET is improved and electrical resistance is reduced in an on-state, thereby making it easy to improve the current driving ability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view showing MOSFET relating to a first embodiment of the present invention;

FIG. 3 is a cross sectional view showing a second embodiment of the present invention.

DETAILED DESCRIPTION OF THE PREFERRED EMBODIMENTS

Figure 2A:
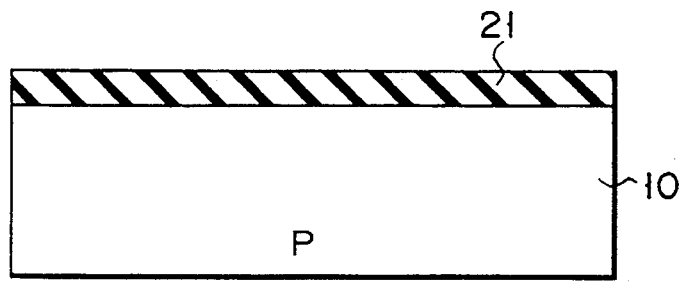
FIGS. 2A to 2N are cross sectional views showing a method for forming the MOSFET of FIG. 1.

The embodiments of the present invention will be explained with reference to the drawings.

FIG. 1 shows a MOSFET section in a semiconductor device (individual semiconductor element or a semiconductor integrated circuit) relating to a first embodiment of the present invention.

A source region 11, which is formed of a second conductivity type (N type in this embodiment) impurity diffusion layer, and a drain region 12 are respectively formed on a part of a surface of a first conductivity type (P type in this embodiment) semiconductor substrate 10.

On a channel region 13 between the source and drain, there is formed a gate electrode G through a gate insulating film 14. A source electrode S and a drain electrode D are in contact with each other to correspond to the source region 11 and the drain region 12. In this case, the thickness of the gate insulating film 14 of the MOSFET is thickened at least in a two-step (four-step in this embodiment) manner in a direction from the source side to the drain side. Impurity concentration of the respective channel regions under the gate insulating film 14 having a different film thickness is different. Impurity concentration of the channel region under the thick film portion of the gate insulating film is lower than that of the channel region under the thin film portion of the gate insulating film. In other words, impurity concentration (P1, P2, P3, P4) is gradually lowered (Pi > P2 > P3 > P4) in the order of the channel regions (13-1, 13-2, 13-3, 13-4) sequentially existing in the direction from the channel region 13-1 on the source side to the channel region 13-4 on the drain side.

Figure 2B:
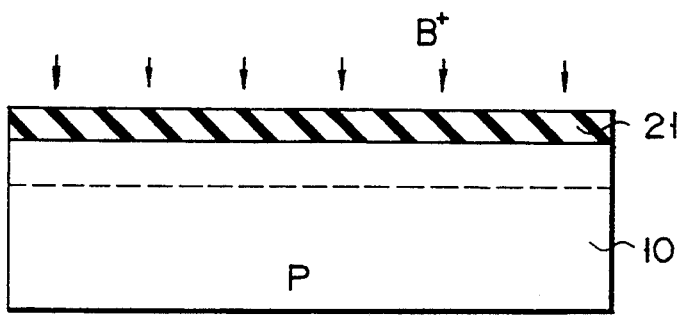
Figure 2C:
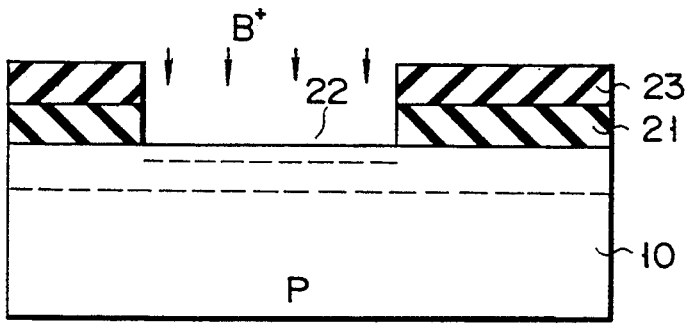
Figure 2D:
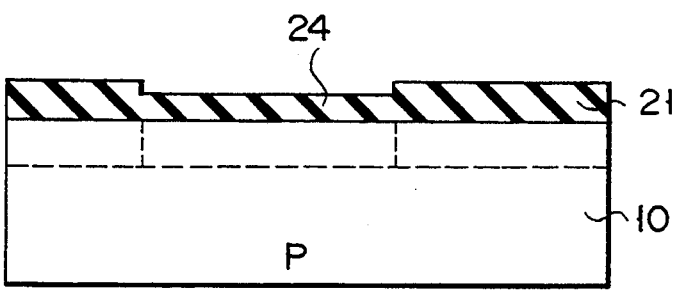
Figure 2E:
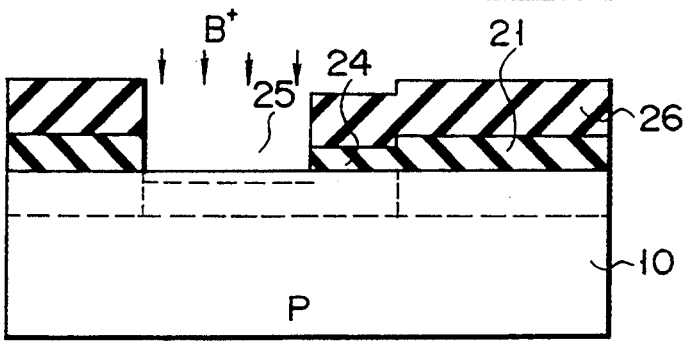
Figure 2F:
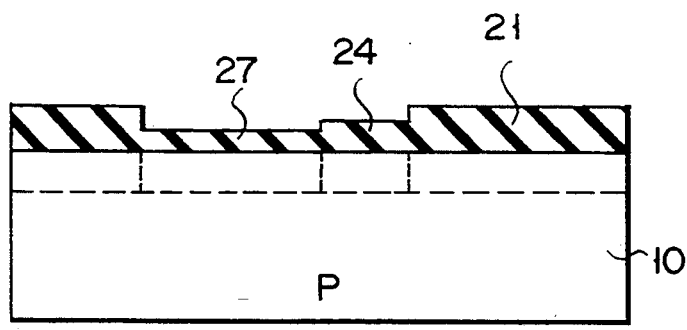
Figure 2G:
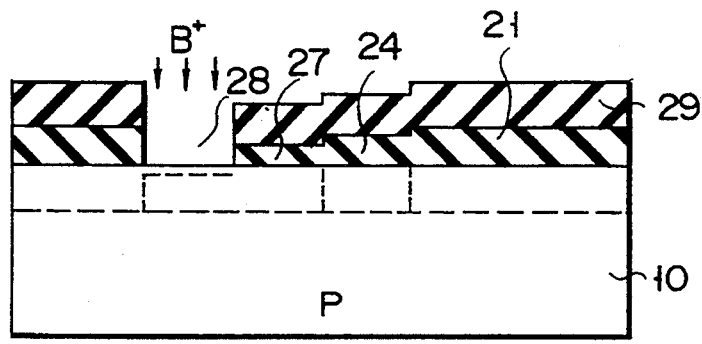
Figure 2H:
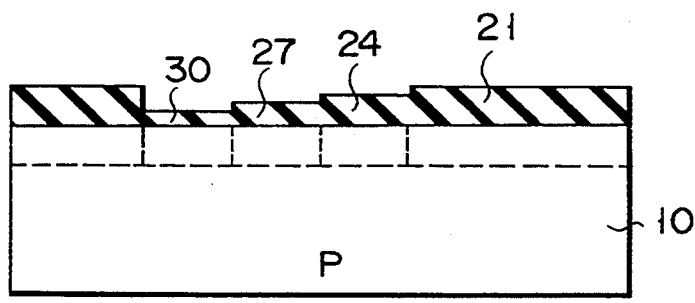
Figure 2I:
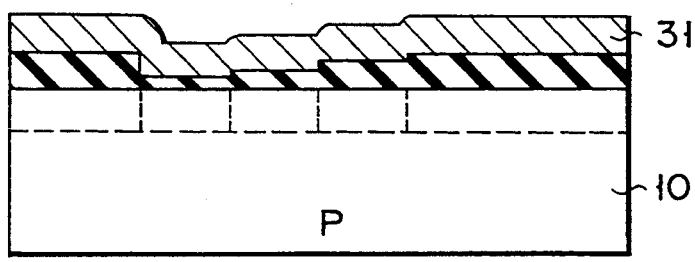
Figure 2J:
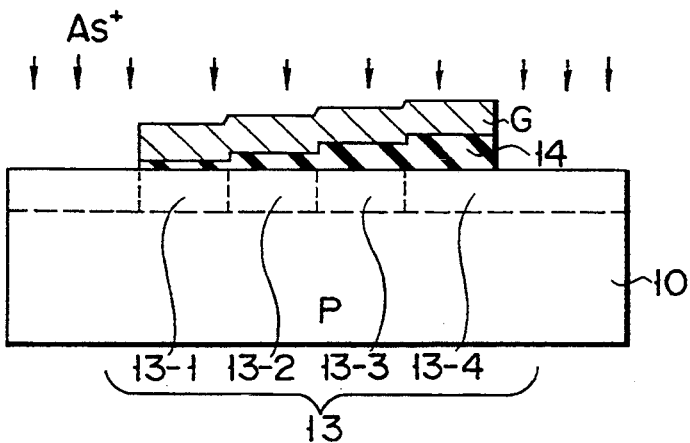
Figure 2K:
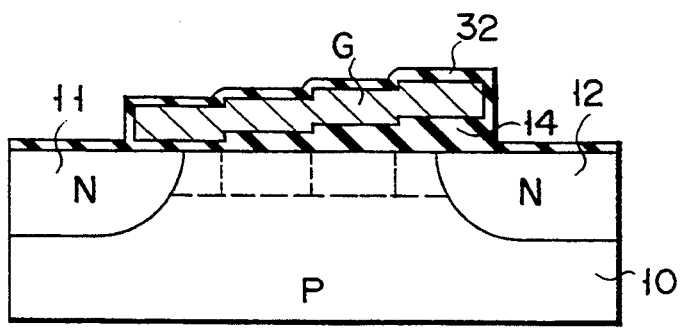
Figure 2L:
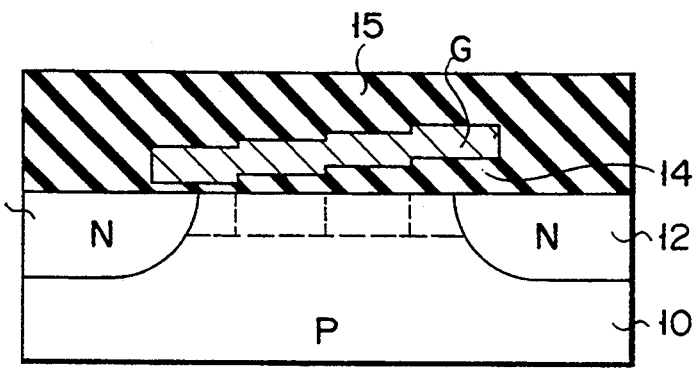
Figure 2M:
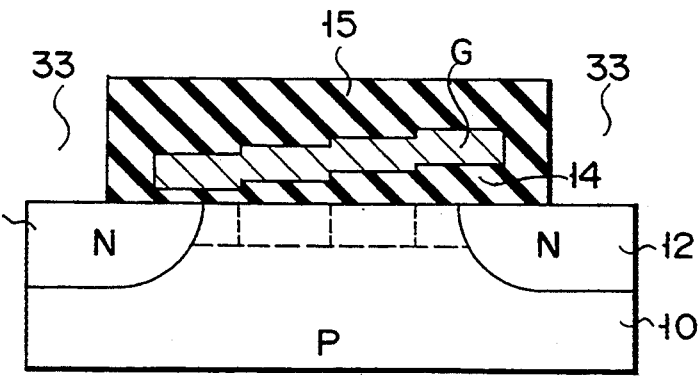
Figure 2N:
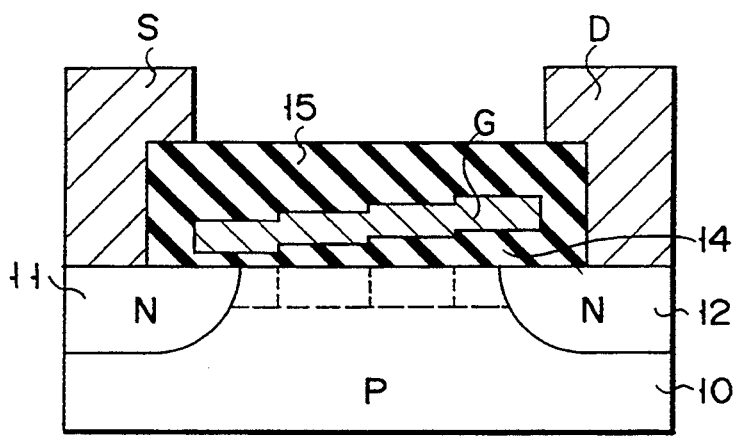

FIGS. 2A to 2N briefly explain one example of a method of a N channel MOSFET whose thickness of the gate insulating film 14 is formed in a four-step manner.

As shown in FIG. 2A, there is formed a first gate insulating film (SiO$_2$) having a thickness of 200Å as a whole on a P type silicon substrate 10 by dry oxidization in O$_2$ ambient atmosphere at 950° C.

As shown in FIG. 2B, an ion of P type impurity (for example, Boron ion B$^+$) is implanted into the entire surface of the substrate by an ion implantation. Thereafter, an anneal process is performed in N$_2$ ambient atmosphere at 950° C. for 30 min.

As shown in FIG. 2C, a part of the first gate insulating film 21 is opened by a photo etching method, and boron ion B$^+$ is implanted into an opening 22 by an ion implantation. In this case, reference numeral 23 is a photoresist.

As shown in FIG. 2D, there is formed a second gate insulating film (SiO$_2$) 24 having a thickness of 200Å in the opening 22 by dry oxidization in O$_2$ ambient atmosphere at 950° C. At this time, the first gate insulating film 21 grows to have the thickness of 300Å.

As shown in FIG. 2E, a part of the second gate insulating film 24 is opened by a photo etching method, and boron ion B$^+$ is implanted into an opening 25 by an ion implantation. In this case, reference numeral 26 is a photoresist.

As shown in FIG. 2D, there is formed a third second gate insulating film (SiO$_2$) 27 having a thickness of 150Å in the opening 25 by dry oxidization in O$_2$ ambient atmosphere at 950° C. At this time, the second gate insulating film 24 grows to have the thickness of 250Å and the first gate insulating film 21 grows to have thickness of 350Å.

As shown in FIG. 2G, a part of a third gate insulating film 27 is opened by a photo etching method, and boron ion B$^+$ is implanted into an opening 28 by an ion implantation. In this case, reference numeral 29 is a photoresist.

As shown in FIG. 2H, there is formed a fourth gate insulating film (SiO$_2$) 30 having a thickness of 100Å in the opening 28 by dry oxidization in O$_2$ ambient atmosphere at 900° C. At this time, the third gate insulating film 27 grows to have the thickness of 200Å, the first gate insulating film 21 grows to have the thickness of 400Å.

As shown in FIG. 2I, a polysilicon film 31 is deposited on the entire surface of the substrate by a CVD (Chemical Vapor-phase Deposition) method to have the thickness of 2000Å.

As shown in FIG. 2J, the polysilicon film 31 is patterned by the photo etching method, and a gate electrode G is formed. Thereafter, the gate electrode G is masked and an exposing portion of the first gate insulating film 21 is removed. Thereby, there can be obtained a gate insulating film 14 to have the thickness in a four-step manner in the order of the fourth gate insulating film 30, the third gate insulating film 27, the second gate insulating film 24, and the first gate insulating film 21. Also, the channel regions (13-1, 13-2, 13-3, 13-4) whose impurity concentration (P1, P2, P3, P4) is sequentially lowered exist under the fourth gate insulating film 30, the third gate insulating film 27, the second gate insulating film 24, and the first gate insulating film 21. Moreover, N type impurity ion (for example, arsenic ion As$^+$) is implanted in the entire surface by the ion implantation.

As shown in FIG. 2K, there is formed an insulating film (SiO$_2$) 32 having a thickness of 200Å to cover the entire surface of the substrate by dry oxidization in O$_2$ ambient atmosphere at 900° C. At the same time, the implanted arsenic ion is made active, thereby the source region 11 and the drain region 12 are formed.

As shown in FIG. 2L, an interlayer insulating film (SiO$_2$) 15 is deposited on the entire surface of the substrate to have a thickness of 0.5 μm by the CVD method, thereafter an anneal process is performed in N$_2$ ambient atmosphere at 950° C.

As shown in FIG. 2M, a part of the interlayer insulating film 15 is opened by the photo etching method, thereby forming a contact hole 33.

As shown in FIG. 2N, a metal wire film (for example, Al) is evaporated on the entire surface of the substrate to have a thickness of 1 μm. Thereafter, the metal wire film is patterned by the photo etching. Thereby, there is formed a source electrode S, which is in contact with the source region 11 and the drain region 12 through the contact hole 33, and a drain electrode D. Thereafter, a sinter process is performed at temperature of 400° C.

According to the MOSFET of the first embodiment, the portion (between the drain and gate electrode) having the strongest electric filed in the gate insulating film 14 is formed to be the thickest portion. Then, impurity concentration of the channel region 13-4 right under such a portion is reduced most. In other words, by controlling the distribution of the thickness of the gate insulating film and the distribution of impurity concentration of the channel regions 13-1 to 13-4, the distribution of the electric field can be appropriately set to equalize the electric field in the MOSFET.

Therefore, as compared with the prior art, the electrical field between the drain and gate electrode becomes weaker and the drop voltage of the drain connection rises. Moreover, breakage of the gate insulating film 14 is difficult to be generated due to a hot carrier, thereby improving reliability of the element. Furthermore, punch resisting pressure between the source and drain is improved, and the punch-through dropping of the depletion layer, which is from the drain region 12 to the source region 11 can be prevented, and the distance (gate length) between the source and drain can be shortened, and made fine. Moreover, since the average value of the thickness of the gate insulating film 14 is reduced, the current driving ability per a gate can be improved and the switching speed is improved, and the channel resistance is reduced. For these reasons, as compared with the prior art, it is possible to largely reduce the area of the element and largely improve the operation speed of the element.

Moreover, the threshold voltages of the respective channel regions 13-1 to 13-4 under the gate insulating film 14 having a different thickness are set to be substantially equal, thereby evenness of the electric field and that of the threshold voltage can be appropriately set.

FIG. 3 shows a MOSFET of source and drain changeable type in the semiconductor device of the present invention relating to the second embodiment. As compared with the MOSFET of the first embodiment, the thickness of a gate insulating film 14' is thickened at least in a two-step (in this embodiment, four-step) manner in a direction from the portion corresponding to the central portion between of the source and drain to one source and drain electrode SD side and other source and drain electrode SD' side. The impurity concentration of the respective channel regions under the gate insulating film 14' having a different film thickness is different. The impurity concentration of the channel region under the thick film portion of the gate insulating film is lower than that of the channel region under the thin film portion of the gate insulating film. In other words, impurity concentration P1, (P2, P2'), (P3, P3'), (P4, P4') is gradually lowered in the order of the channel regions (13-1, 13-2, 13-3, 13-4) which sequentially exist directing from the channel region 13-1 of the central portion between the source and drain to the channel region 13-4 on one source and drain region 16 or the channel region 13-4' on the other source and drain region 16', or in the order of the channel regions (13-1', 13-2', 13-3', 13-4') (P1 >P2 Å P2'>P3ÅP3'>P4ÅP4'). In FIG. 3, G' is a gate electrode, and the same reference numerals are added to the same portions as the FIG. 1.

According to the above-explained MOSFET of the second embodiment, even if the drain and source are changed, there is an advantage in that the same effect as the first embodiment can be obtained.

According to the above-mentioned semiconductor device of the present invention, the electrical distribution in the MOSFET is appropriately set, thereby making it possible to realize to ensure reliability of the gate insulating film on the drain side, reduce the threshold voltage, and improve the electrical resisting pressure. Also, the punch-through dropping of the depletion layer, which is from the drain region to the source region can be prevented. The gate length can be shortened, and made fine. Moreover, since the average value of the thickness of the gate insulating film is reduced, thereby making it easy to reduce the on-resistance, improve the switching speed and the current driving ability.

Additional advantages and modifications will readily occur to those skilled in the art. Therefore, 10 the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A field effect transistor comprising:
a first conductivity type semiconductor substrate;
a second conductivity type source region formed on the semiconductor substrate;
a second conductivity type drain region formed on the semiconductor substrate and non-contacting the source region;
a first portion of a gate electrode formed above the thickness interposed therebetween, the first gate electrode portion located in the neighborhood of the source region;
a second portion of said gate electrode formed above the semiconductor substrate, with an insulation film of a second thickness greater than said first thickness being interposed therebetween, the second gate electrode portion located in the neighborhood of the drain region and electrically connected to the first gate electrode portion;
a first channel region located just under the first gate electrode portion and having a first impurity concentration; and
a second channel region located just under the second gate electrode portion and having a second impurity concentration which is lower than the first impurity concentration and which is higher than an impurity concentration of the semiconductor substrate.

2. A field effect transistor comprising:
a first conductivity type semiconductor substrate;
a second conductivity type source region formed on the semiconductor substrate;
a second conductivity type drain region formed on the semiconductor substrate and non-contacting the source region;
a first portion of a gate electrode formed above the semiconductor substrate, with an insulation film of a first thickness being interposed therebetween, said first gate electrode portion being located in the neighborhood of the source region;
a second portion of said gate electrode formed above the semiconductor substrate, with an insulation film of a second thickness greater than said first thickness being interposed therebetween, said second gate electrode portion being located closer to the drain region than the first gate electrode portion and electrically connected to the first gate electrode portion;
a third portion of said gate electrode formed above the semiconductor substrate, with an insulation film of a third thickness greater than said second thickness being interposed therebetween, said third gate electrode portion being located closer to the drain region than the second gate electrode portion and electrically connected to the second gate electrode portion;
a fourth portion of said gate electrode formed above the semiconductor substrate, with an insulation film of a fourth thickness greater than said third thickness being interposed therebetween, said fourth gate electrode portion being located closer to the drain region than the third gate electrode portion and electrically connected to the third gate electrode portion;
a first channel region located just under the first gate electrode portion and having a first impurity concentration;
a second channel region located just under the second gate electrode portion and having a second impurity concentration lower than the first impurity concentration;
a third channel region located just under the third gate electrode portion and having a third impurity concentration lower than the second impurity concentration; and
a fourth channel region located just under the fourth gate electrode portion and having a fourth impurity concentration lower than the third impurity concentration.

3. A field effect transistor according to claim 2, wherein the fourth impurity concentration is higher than an impurity concentration of the semiconductor substrate.

* * * * *

UNITED STATES PATENT AND TRADEMARK OFFICE
CERTIFICATE OF CORRECTION

PATENT NO. : 5,422,505
DATED : June 06, 1995
INVENTOR(S) : Koji Shirai

It is certified that error appears in the above-indentified patent and that said Letters Patent is hereby corrected as shown below:

Claim 1, Column 5, Line 56, before "thickness" insert --semiconductor substrate, with an insulation film of a first--.

Signed and Sealed this

Twenty-seventh Day of February, 1996

Attest:

BRUCE LEHMAN

Attesting Officer

Commissioner of Patents and Trademarks